United States Patent
Monden

(10) Patent No.: US 8,044,694 B2
(45) Date of Patent: Oct. 25, 2011

(54) SEMICONDUCTOR INTEGRATED CIRCUIT HAVING LATCH CIRCUIT APPLIED CHANGEABLE CAPACITANCE AND METHOD THEREOF

(75) Inventor: Junji Monden, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 72 days.

(21) Appl. No.: 12/458,720

(22) Filed: Jul. 21, 2009

(65) Prior Publication Data

US 2010/0019839 A1    Jan. 28, 2010

(30) Foreign Application Priority Data

Jul. 25, 2008  (JP) .................. 2008-192796

(51) Int. Cl.
  *H03K 3/00* (2006.01)
(52) U.S. Cl. ....................................... 327/201
(58) Field of Classification Search .......... None
  See application file for complete search history.

(56) References Cited

U.S. PATENT DOCUMENTS 7,612,594 B2 * 11/2009 Fukuoka ................. 327/215

2006/0095975 A1 * 5/2006 Yamada et al. ................. 726/27
2008/0048744 A1   2/2008 Fukuoka
2010/0213998 A1 * 8/2010 Uemura et al. ............. 327/203

FOREIGN PATENT DOCUMENTS

JP  2006-65919   3/2006
JP  2008-52847   3/2008

OTHER PUBLICATIONS

Karnik, et al., "Selective Node Engineering for Chip-Level Soft Error Rate Improvement", 2002 Symposium on VLSI Circuits, Digest of Technical Papers, Jun. 2002, pp. 204-205.

* cited by examiner

*Primary Examiner* — Lincoln Donovan
*Assistant Examiner* — Sibin Chen
(74) *Attorney, Agent, or Firm* — McGinn Intellectual Property Law Group, PLLC

(57) ABSTRACT

A semiconductor integrated circuit includes a flip-flop circuit, a capacitive element, and a switch circuit. The switch circuit includes a first switch circuit which couples the capacitive element to two nodes of the flip-flop circuit at a first timing, and a second switch circuit which short-circuits ends of the capacitive element connected to the two nodes at a second timing different from the first timing.

20 Claims, 5 Drawing Sheets

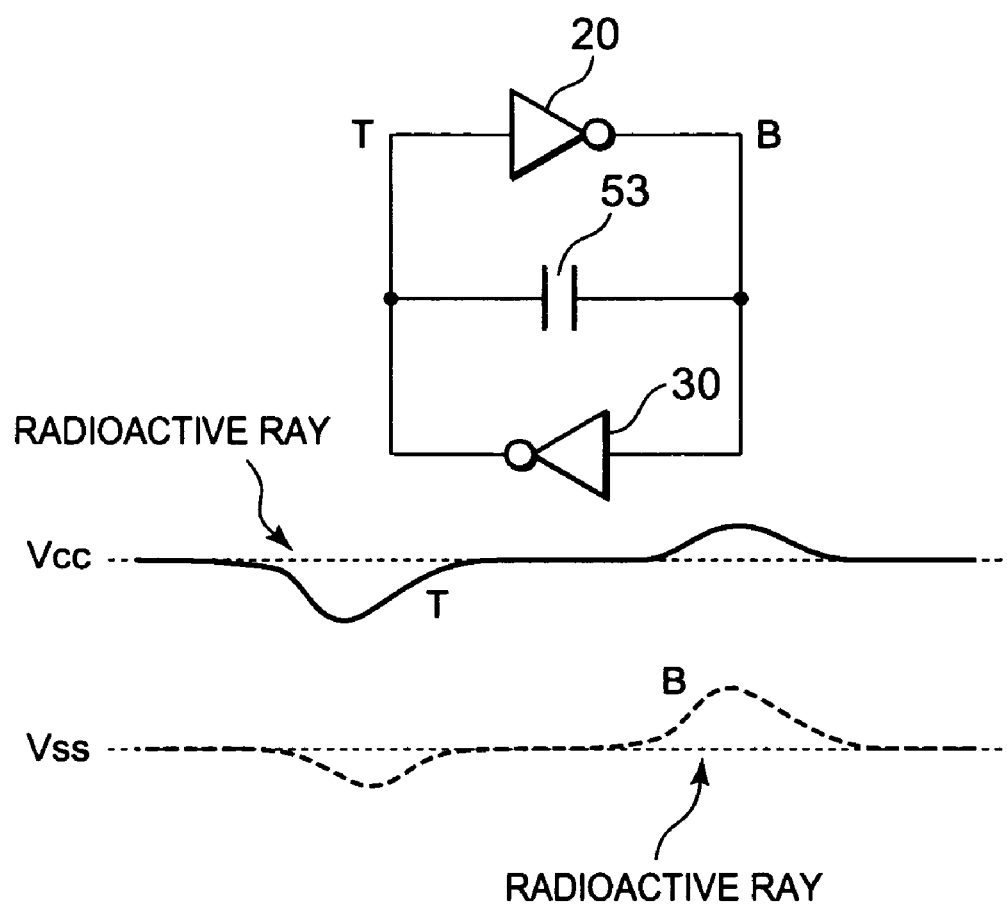

SEMICONDUCTOR INTEGRATED CIRCUIT HAVING LATCH CIRCUIT APPLIED CHANGEABLE CAPACITANCE AND METHOD THEREOF

INCORPORATION BY REFERENCE

This application is based upon and claims the benefit of priority from Japanese Patent Application No. 2008-192796 which was filed on Jul. 25, 2008, the disclosure of which is incorporated herein in its entirety by reference.

BACKGROUND OF THE INVENTION

1. Field of the Invention

The present invention relates to a semiconductor integrated circuit and, more particularly, to a semiconductor integrated circuit having a latch circuit and a method of preventing a semiconductor integrated circuit from malfunctioning.

2. Description of Related Art

In some case, radioactive rays penetrate a semiconductor integrated circuit. Alpha rays, neutron rays and the like are conceivable as such radioactive rays. In some case, alpha rays are generated when a radioactive isotope contained in a semiconductor integrated circuit package or wiring. Neutron rays derive from cosmic rays. In some case, electrical noise is generated in a semiconductor circuit by a radioactive ray to cause a malfunction. A malfunction due to a radioactive ray is called a soft error in contrast with a hard error due to a fixed fault.

In general, a soft error is a temporary malfunction. For example, in the case of a latch circuit included in a semiconductor integrated circuit, a variation in voltage at a storage node is insignificantly small if the charge capacity of the storage node is sufficiently large. In recent years, however, the miniaturization of semiconductor integrated circuits has advanced. With this, the charge capacity of a latch circuit at a storage node has been reduced. As a result, the logical level of latched data can be easily inverted by the generation of electrical noise. That is, in recent years, a malfunction due to a radioactive ray in a latch circuit included in a semiconductor integrated circuit can become a fixed error.

Non-Patent Document 1 describes a technique to improve the soft-error tolerance of a latch circuit. FIG. 1 is a circuit diagram showing a latch circuit described in non-patent document 1. In this latch circuit, an input signal from an input end IN is latched when a clock signal CK is high level. When the clock signal CK is low level, the input signal input from the input end IN is directly output from an output end OUT. That is, the latch circuit is in a pass-through state when the clock signal CK is low level. In this latch circuit, a capacitor is connected through a transfer gate A to the output end OUT, which also serves as a storage node. At the time of latching, the transfer gate A is made conductive to electrically connect the capacitor to the output end OUT. As a result, the charge capacity at the storage node of the output end OUT is increased. By the increase in charge capacity, variation in voltage at the storage node is made insignificantly small even when electrical noise occurs due to a radioactive ray, thus enabling latched data to be correctly maintained. At the time of pass-through, the capacitor is electrically isolated from the storage node (output end OUT). Therefore no delay of the rate of transfer of data occurs at the time of pass-through. The soft-error tolerance of the latch circuit is thus improved while maintaining high-speed operation.

[Non-Patent Document 1] T. Karnik, et al, "Selective node engineering for chip-level soft error rate improvement", 2002 Symposium on VLSI Circuits, Digest of Technical Papers, June 2002, pp. 204-205

Patent Document 1 (Japanese Patent Laid-Open No. 2006-65919) and patent document 2 (Japanese Patent Laid-Open No. 2008-52847) also describe other techniques as measures against soft errors.

Patent Document 1 discloses a memory circuit including a latch circuit, and a ferroelectric capacitor connected to the latch circuit via a transfer gate. Regarding the technology of Document 1, when writing a data to the latch circuit, at that time a voltage potential corresponding a node of the latch circuit is held at one electrode of the capacitor and the complementary voltage potential corresponding the other node of the latch circuit is maintained at the other electrode of the capacitor.

Patent Document 2 discloses a latch circuit, with two capacitors each connected to the latch circuit via switching elements. The Document 2 further discloses inverters each of which connects the respective capacitor with the respective nodes of the latch circuit without intervening the switching elements. Based on the driving condition, this technology can enlarge the capacitance of the latch circuit.

SUMMARY

In the latch circuit shown in FIG. 1, the output end OUT is assumed to be low level at the time of latching. At this time, the voltage on the transfer gate A side in the capacitor is Vss. It is assumed that the circuit state is thereafter changed from the latching state to the pass-through state. Even after the circuit state has been changed to the pass-through state, the voltage on the transfer gate A side of the capacitor is maintained at the reference voltage Vss. It is assumed that the logical level of an input signal is inverted in the pass-through state, that is, the logical level of the voltage at the output end OUT is changed from low level to high level. It is assumed that thereafter the circuit state is again changed from the pass-through state to the latching state. When the circuit state is changed to the latching state, the transfer gate A is changed into the conductive state. At the moment of this change, the capacitor is connected to the output end OUT. At this time, the voltage at the output end OUT is high level (Vcc) and the voltage on the capacitor side is Vss. Charge transfer then occurs between the output end OUT and the capacitor. That is, the capacitor is charged from the output end OUT side. By charging, the voltage at the output end OUT is reduced for an instant. The larger the capacitance of the capacitor, the larger the amount of reduction in voltage at the output end OUT. The logical level of an output signal from a clocked inverter (INV2) included in the latch circuit may be inverted by the reduction in voltage at the output end OUT. That is, incorrect data may be latched.

With respect to Patent Document 1, the complementary voltage potentials are maintained by the capacitor. Therefore, when the latch circuit latch an inverted data, inverting also the complementary voltage potentials is required. Thus, a long period is required to sufficiently invert the potential enough to correctly latch the data by the latch circuit. Accordingly, this technology has a problem in point of view of the high speed operation.

Patent Document 2 has the same problem as that of the Patent Document 1. That is, each capacitor stores the complementary voltage potentials. Therefore, when the latch circuit latches an inverted data, then the complementary voltage potentials at the capacitors are inverted. Therefore, this technology requires a period when the complementary voltage potentials are inverted, for example, a ground potential to a power source potential.

A semiconductor integrated circuit according to an exemplary aspect of the present invention includes a first inverter circuit which logically inverts a signal input from its input end and outputs the inverted signal from its output end, a second inverter circuit which inverts the logical level of the signal output from the first inverter circuit and thereafter outputs the signal, a pass-through/latch selector circuit which electrically connects an output end of the second inverter circuit and the input end of the first inverter circuit with each other at the time of latching, and which electrically shuts off the output end of the second inverter circuit and the input end of the first inverter circuit from each other at the time of pass-through, a capacitive element which has a first end and a second end, which increases the charge capacity at the output end of the first inverter circuit when the first end is connected to the output end of the first inverter circuit, and which increases the charge capacity at the output end of the second inverter circuit when the second end is connected to the output end of the second inverter circuit, and a malfunction-preventing selector circuit which electrically connects the first end and the second end respectively to the output end of the first inverter circuit and the output end of the second inverter circuit at the time of latching, and which connects the first end and the second end with each other so that voltages are averaged at the time of pass-through.

According to the exemplary aspect of the present invention, at the time of latching, the capacitive element is connected to the first and second inverter circuits to increase the electrical capacity. The logical level of latched data is thereby made not easily invertible. On the other hand, at the time of pass-through, the voltages at the first end and the second end are averaged by the malfunction-preventing selector circuit group, thereby enabling reducing the amount of charge transfer between the output end of the first inverter circuit and the first terminal when a change from the pass-through state to the latching state is again made. The same effect as that between the output end of the first inverter circuit and the first end is achieved between the output end of the second inverter circuit and the second end. As a result, changes in voltage at the output ends of the first inverter circuit and the second inverter circuit can be reduced to prevent a malfunction.

The semiconductor integrated circuit according to another exemplary aspect of the present invention includes a flip-flop circuit, a capacitive element, and a switch circuit, the switch circuit having a first switch circuit which couples the capacitive element to two nodes of the flip-flop circuit at a predetermined timing, and a second switch circuit which short-circuits ends of the capacitive element connected to the two nodes at a timing different from the predetermined timing.

A method of preventing a malfunction in a semiconductor integrated circuit according to another exemplary aspect of the present invention is a method of preventing a malfunction in a semiconductor integrated circuit having a first inverter circuit which logically inverts a signal input from its input end and outputs the inverted signal from its output end, a second inverter circuit which inverts the logical level of the signal output from the first inverter circuit and thereafter outputs the signal, a pass-through/latch selector circuit group which electrically connects an output end of the second inverter circuit and the input end of the first inverter circuit with each other at the time of latching, and which electrically shuts off the output end of the second inverter circuit and the input end of the first inverter circuit from each other at the time of pass-through, and a capacitive element group which increases the electrical capacity at an output end of the first inverter circuit and at an output end of the second inverter circuit at the time of latching. This malfunction prevention method includes a step of connecting a first end of the capacitive element group to the output end of the first inverter circuit and a second end of the capacitive element group to the output end of the second inverter circuit at the time of latching, and a step of connecting the first end and the second end with each other so that voltages are averaged at the time of pass-through.

According to the exemplary aspects of the present invention, a semiconductor integrated circuit and a method capable of preventing a malfunction are provided.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 6 is a circuit diagram showing an equivalent circuit of the semiconductor integrated circuit according to the second exemplary embodiment.

DETAILED DESCRIPTION OF THE EXEMPLARY EMBODIMENTS

First Exemplary Embodiment

Figure 1:
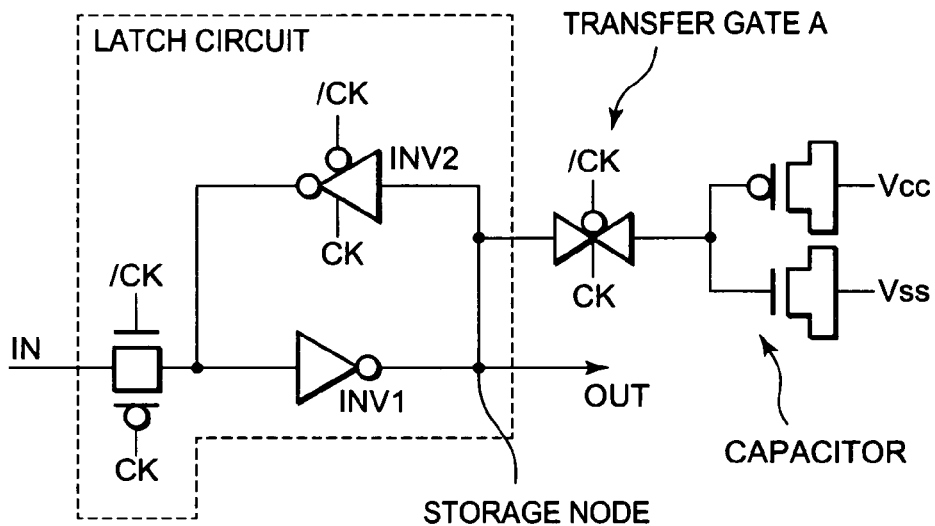
FIG. 1 is a circuit diagram showing a semiconductor integrated circuit of a related art.
Figure 2:
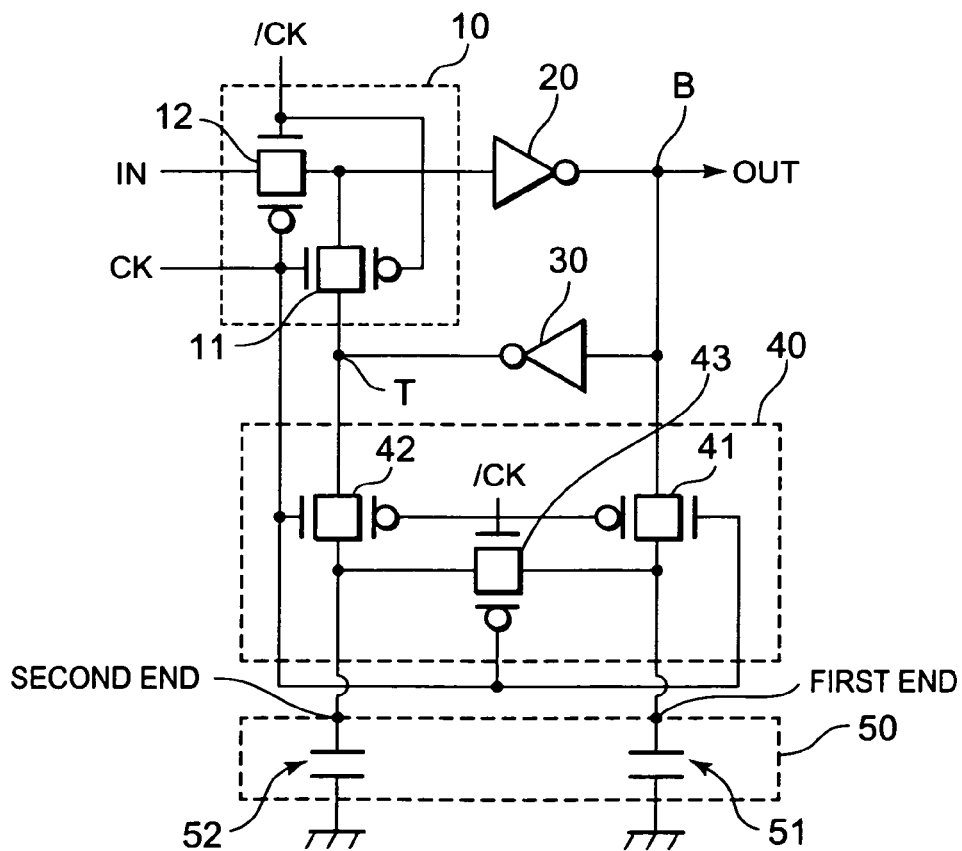
FIG. 2 is a circuit diagram showing a semiconductor integrated circuit according to a first exemplary embodiment.

FIG. 2 is a circuit diagram showing a semiconductor integrated circuit according to a first exemplary embodiment. This semiconductor integrated circuit is provided with an input end IN and an output end OUT. This semiconductor integrated circuit receives an input signal from the input end IN and outputs an output signal to the output end OUT.

The semiconductor integrated circuit has a flip-flop circuit, a capacitive element and a switch circuit, as shown in outline. The switch circuit includes a first switch circuit and a second switch circuit. The first switch circuit couples the capacitive element to two nodes of the flip-flop circuit at a predetermined timing. The second switch circuit short-circuits ends of the capacitive element connected to the two nodes at a timing different from the predetermined timing.

More specifically, as shown in FIG. 2, the semiconductor integrated circuit has, as the above-mentioned flip-flop circuit, a first inverter circuit 20, a second inverter circuit 30 and a pass-through/latch selector circuit group 10. The semiconductor integrated circuit has a malfunction-preventing selector circuit group 40 as the switch circuit and has a capacitive element group 50 as the above-mentioned capacitive element. It is assumed that a power supply voltage to the first inverter circuit 20 and the second inverter circuit 30 is Vcc and a reference voltage Vss is 0 V.

The input end IN is connected to an input end of the first inverter circuit 20 through the pass-through/latch selector circuit group 10. An output end of the first inverter circuit 20 is connected to the output end OUT and to an input end of the second inverter circuit 30. An output end of the second inverter circuit 30 is connected to the input end of the first inverter circuit 20 through the pass-through/latch selector circuit group 10.

The pass-through/latch selector circuit group 10 is a circuit for changing the circuit state. The circuit state of this semiconductor integrated circuit is changed between a pass-through state and a latching state by the pass-through/latch selector circuit group 10. The pass-through/latch selector circuit group 10 has a transfer gate 11 and a transfer gate 12. The transfer gate 11 is provided between the output end of the second inverter circuit 30 and the input end of the first inverter circuit 20. The transfer gate 12 is provided between the input end IN and the input end of the first inverter circuit 20.

The states (conductive states or shutoff states) of the transfer gate 11 and the transfer gate 12 are changed by a clock signal CK and an inverted clock signal /CK. More specifically, the transfer gate 11 is set in the conductive state when the inverted clock signal is low level, and is set in the shutoff state when the inverted clock signal /CK is high level. The transfer gate 12 is set in the conductive state when the clock signal CK is low level, and is set in the shutoff state when the clock signal CK is high level.

In the pass-through/latch selector circuit group 10, at the time of pass-through, the transfer gate 12 is set in the conductive state. The transfer gate 11 is set in the shutoff state. An input signal is thereby supplied from the input end IN to the input end of the first inverter circuit 20. The first inverter circuit 20 inverts the logical level of the input signal and outputs the inverted input signal as an output signal to the output end OUT.

On the other hand, at the time of latching, the transfer gate 12 is shut off. The transfer gate 11 is changed into the conductive state. The signal output from the first inverter circuit 20 is inverted in logical level by the second inverter circuit 30 and fed back to the input end of the first inverter circuit 20. As a result, the input signal is latched by the first inverter circuit 20 and the second inverter circuit 30. The first inverter circuit 20 and the second inverter circuit 30 can be said to thus constitute a flip-flop circuit. The output ends of the first inverter circuit 20 and the second inverter circuit 30 function as storage nodes of the flip-flop circuit. In the following, the output end of the first inverter circuit 20 is referred to as a storage node B and the output end of the second inverter circuit 30 is referred to as a storage node T.

The capacitive element group 50 is provided for the purpose of increasing the charge capacities of the storage node T and the storage node B. The capacitive element group 50 has a first capacitor 51 and a second capacitor 52. The first capacitor 51 has its one end (first end) connected to the storage node B through the malfunction-preventing selector circuit group 40. The other end of the first capacitor 51 is grounded. The second capacitor 52 has its one end (second end) connected to the storage node T through the malfunction-preventing selector circuit group 50. The other end of the second capacitor 52 is grounded. The first capacitor 51 and the second capacitor 52 are equivalent to each other. The capacitors 51, 52 may be provided by a dielectric capacitor which has an insulating film sandwiched by two electrodes and different from a ferroelectric film.

The malfunction-preventing selector circuit group 40 connects the capacitive element group 50 to the storage nodes (T, B) at the time of latching. At the time of pass-through, the malfunction-preventing selector circuit group 40 disconnects the storage nodes (T, B) and the capacitive element group 40 from each other and averages (equalizes) the voltages at the first end and the second end in the capacitive element group 50.

The malfunction-preventing selector circuit group 40 has a transfer gate 41 and a transfer gate 42 as the first switch circuit and also has a transfer gate 43 as the second switch circuit. The transfer gate 41 is provided between the first capacitor 51 and the storage node B. The transfer gate 42 is provided between the second capacitor 52 and the storage node T. The transfer gate 43 is provided between the first capacitor 51 and the second capacitor 52. The transfer gate 41 and the transfer gate 42 are set in the conductive states when the inverted clock signal /CK is low level, and are set in the shutoff states when the inverted clock signal /CK is high level, as is the transfer gate 11. The transfer gate 43 is also set in the conductive state when the clock signal CK is low level, and is set in the shutoff state when the clock signal CK is high level, as is the transfer gate 12.

That is, the malfunction-preventing selector circuit group 40 couples the capacitive elements to the two nodes (T, B) of the flip-flop circuit by means of the first switch circuit (transfer gate 41 and transfer gate 42) at a predetermined timing. The malfunction-preventing selector circuit group 40 short-circuits the ends (the first and second ends) connected to the two nodes by means of the second switch circuit (transfer gate 43) at a timing different from the predetermined timing.

The operation of the semiconductor integrated circuit according to the first exemplary embodiment will now be described.

At the time of latching, a high-level signal is supplied as the clock signal CK. That is, the transfer gates 12 and 43 are set in the conductive states and the transfer gates 11, 41, and 42 are set in the shutoff states.

Figure 3:
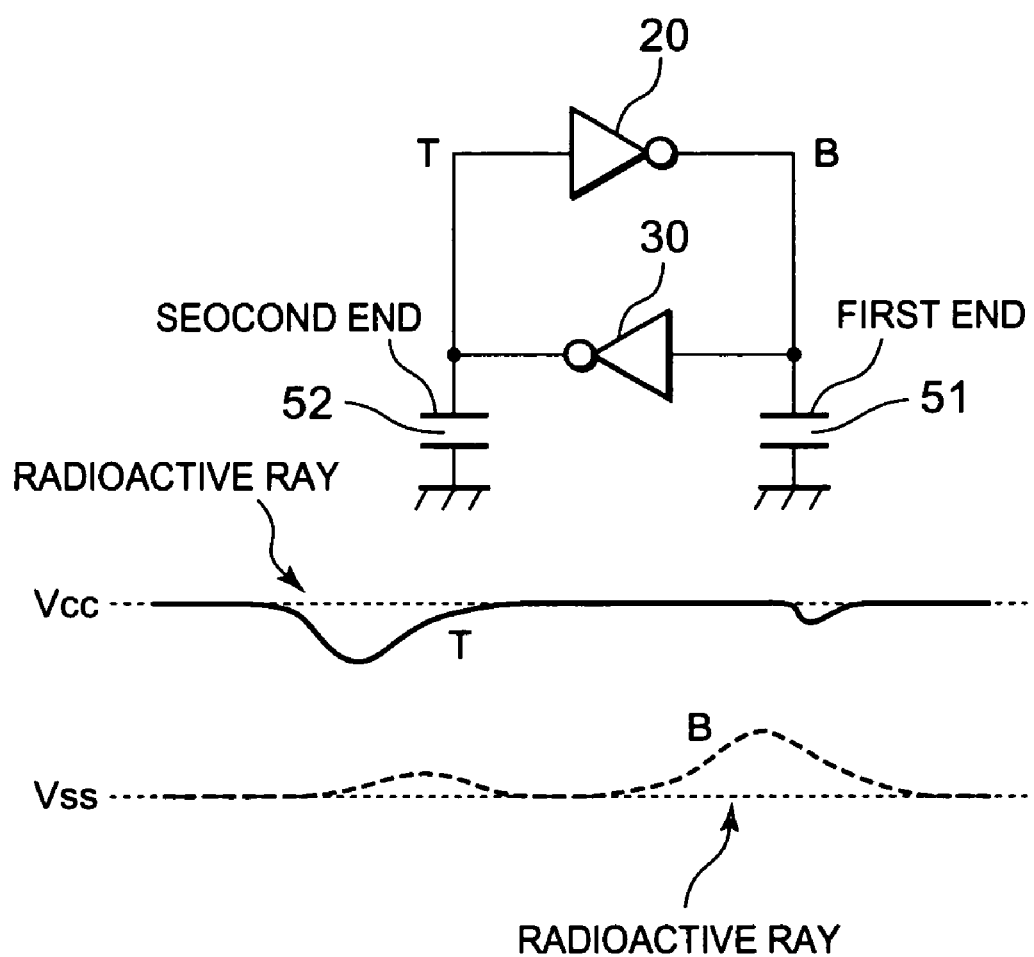
FIG. 3 is a circuit diagram showing an equivalent circuit of the semiconductor integrated circuit according to the first exemplary embodiment.

FIG. 3 shows an equivalent circuit diagram of the semiconductor integrated circuit at the time of latching, and also shows changes in voltage at the storage node B and the storage node T. With respect to FIG. 3, it is assumed that high-level (Vcc) data is stored at the storage node T while low-level (Vss) data is stored at the storage node B.

At the time of latching, one end of the first capacitor 51 (the first end) is connected to the storage node B. By connecting the first capacitor 51, the charge capacity at the storage node B is increased. The charge capacity at the storage node T is also increased by connecting the second capacitor 52.

It is assumed that a radioactive ray is incident on the storage node T (solid line) at a time indicated by an arrow in FIG. 3. It is also assumed that the voltage at the storage node T, which has been high level (Vcc), changes and becomes lower due to a radioactive ray. If the second capacitor 52 is not connected to the storage node T, there is a possibility of the amount of reduction in voltage becoming larger so that the output signal from the first inverter circuit 20 is inverted. In the exemplary embodiment, the charge capacity at the storage node T is increased by the second capacitor 52 and, therefore, a state where the output from the first inverter circuit 20 can be inverted is not reached. Even in a case where a radioactive ray is incident on the storage node B (broken line) at which the low level is maintained, inversion of the logical level is prevented, as in the case of the storage node T.

At the time of pass-through, a low-level signal is supplied as the clock signal CK. At this time, the transfer gates 12 and 43 are set in the conductive states and the transfer gates 11, 41, and 42 are set in the shutoff states. At the time of pass-through, the input signal supplied from the input end IN is inverted in logical level by the first inverter circuit 20 and is output as an output signal to the output end OUT. Since the transfer gates 41 and 42 are set in the shutoff states, the first capacitor 51 and the second capacitor 52 have no influence on the flow of the signal from the input end IN to the output end OUT. The output signal is generated from the output end OUT without being delayed.

Figure 4:
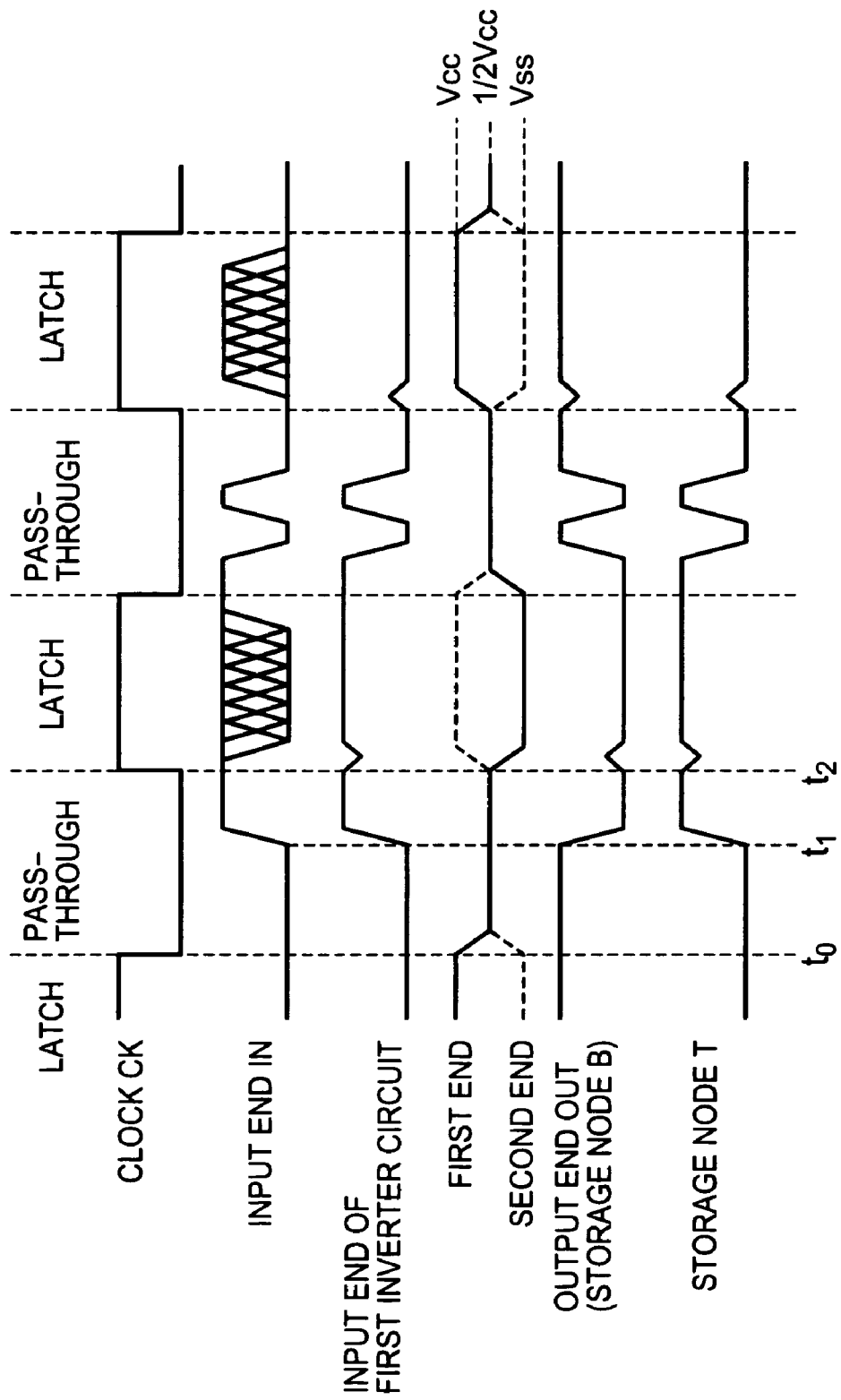
FIG. 4 is a timing chart showing the operation of the semiconductor integrated circuit according to the first exemplary embodiment.

The operation when the state of the circuit is changed from the pass-through state to the latching state will next be described. FIG. 4 is a timing chart showing the operation of the semiconductor integrated circuit according to the exemplary embodiment. FIG. 4 shows changes in voltage of the clock signal CK and changes in voltage at the input end IN, the input end of the first inverter circuit 20, the first end, the second end, the output end OUT (storage node B) and the storage node T. It is assumed that a change from the latching state to the pass-through state is made at time t0 as shown in FIG. 4.

Attention is paid to the voltage at one end of the first capacitor 51 (the first end) and the voltage at one end of the second capacitor 52 (the second end) at time t0. At the time of latching, the first end is connected to the storage node B and the second end is connected to the storage node T. Before time t0, therefore, the first end and the second end have voltages of logical levels opposite to each other. In the example shown in FIG. 4, before time t0, the voltage at the first end is Vcc and the voltage at the second end is Vss (0 V). At the time of pass-through (from time t0 to time t2), the transfer gate 43 is changed into the conductive state. As a result, charge transfer occurs between the first end and the second end and the voltages at the first end and the second end are averaged. That is, the voltages at the first end and the second end are equalized to ½ Vcc.

It is assumed that the input signal supplied from the input end IN is changed from low level to high level at time t1 in the time period for pass-through as shown in FIG. 4. Thereafter, the state of the circuit is changed from the pass-through state to the latching state at time t2. At time t2, the first end is connected to the storage node B through the transfer gate 41. Immediately before time t2, the voltage at the first end is ½ Vcc and the voltage at the storage node B is Vss (low level). At the moment when the first end is connected to the storage node B, therefore, charge transfer occurs between the first end and the storage node B. The voltage at the storage node B is thereby increased for an instant. However, since the voltage at the first end is ½ Vcc, there is no possibility of the voltage at the storage node B becoming equal to or higher than ½ Vcc. If the voltages at the first end and the second end are not averaged, then the voltage at the first end during pass-through is maintained at Vss (0 V). Charge then transfers between the first end at Vss (0 V) and the storage node B at Vcc, so that the voltage at the storage node B changes largely. As a result, the output level of the second inverter circuit 30 becomes easily invertible.

That is, according to the exemplary embodiment, the voltages at the first end and the second end are averaged during pass-through to reduce the amount of change in voltage when the first capacitor 51 is connected to the storage node B. The amount of change in voltage is also reduced at the output end of the second inverter circuit 20 as well as at the storage node B.

According to the exemplary embodiment, as described above, the capacitive element group 50 is connected to the storage nodes (the output ends of the first and second inverter circuits) at the time of latching. Therefore the charge capacities of the storage nodes at the time of latching can be increased, thereby preventing inversion of the logical level even when the voltage levels at the storage nodes are changed by radioactive rays or the like. That is, the soft error tolerance is increased.

In addition, the voltage levels at the first and the second end in the capacitive element group 50 are averaged at the time of pass-through. As a result, a change in voltage when the capacitive element group 50 is connected to the storage nodes (T, B) can be reduced, thus enabling prevention of inversion of the logical level from the proper level in the first and second inverter circuits.

It is preferable that the first inverter circuit 20 and the second inverter circuit 30 have input threshold voltages set to ½ Vcc. As described above, the voltage level at the first end is ½ Vcc at the time of pass-through. After changing into the latching state, therefore, there is no possibility of the amount of change in voltage at the storage node exceeding ½ Vcc. If the input threshold voltage of the first inverter circuit 20 is set to ½ Vcc, then there is theoretically no possibility of the logical level of the storage node B being inverted by charge transfer between the first end and the storage node B. With respect to the second inverter circuit 30 as well as with respect to the first inverter circuit 20, it is theoretically possible to prevent inversion of the logical level at the storage node with reliability by setting the input threshold voltage to ½ Vcc.

Second Exemplary Embodiment

A second exemplary embodiment of the present invention will next be described. In the second exemplary embodiment, the configuration in the capacitive element group 50 is changed from that in the first exemplary embodiment. In the first exemplary embodiment, two capacitors (first capacitor 51 and second capacitor 53) are used as the capacitive element group 50. In the second exemplary embodiment, one capacitor is used as the capacitive element group 50. In other respects, the second exemplary embodiment is the same as the first exemplary embodiment. Therefore the detailed description for the present exemplary embodiment will not be repeated.

Figure 5:
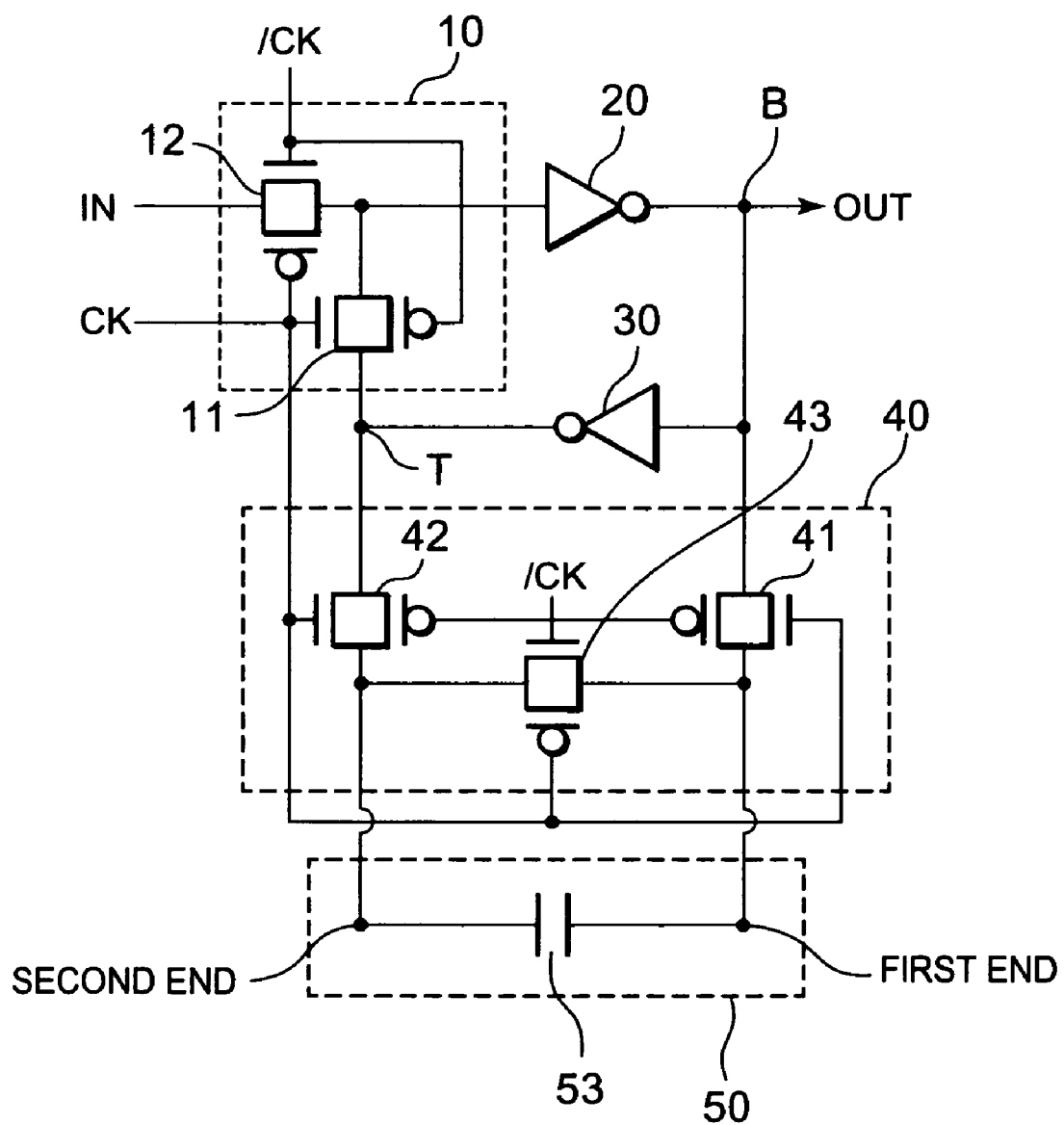
FIG. 5 is a circuit diagram showing a semiconductor integrated circuit according to a second exemplary embodiment.

FIG. 5 is a circuit diagram showing a semiconductor integrated circuit according to the second exemplary embodiment. In the second exemplary embodiment, a capacitor 53 is provided as the capacitive element group 50. One end (the first end) of the capacitor 53 is connected to the storage node B through the transfer gate 41 in the malfunction-preventing selector circuit group 40. The other end (the second end) of the capacitor 53 is connected to the storage node T through the transfer gate 42 in the malfunction-preventing selector circuit group 40. The first end and the second end of the capacitor 53 are short-circuited through the transfer gate 43 in the malfunction-preventing selector circuit group 40.

At the time of latching in the second exemplary embodiment as well as in the first exemplary embodiment, the transfer gates 12 and 43 are set in the conductive states and the transfer gates 11, 41, and 42 are set in the shutoff states. FIG. 6 shows a circuit diagram of the semiconductor integrated circuit at the time of latching. As shown in this figure, the capacitor 53 is connected to the storage node B (storage node B) and to the storage node T (storage node T). The charge capacities at the storage node B and the storage node T are thereby increased. If the voltage level at the storage node B is reduced by a radioactive ray or the like during latching, then the voltage level at the storage node T is also reduced due to the existence of the capacitor 53 between the storage node T and the storage node B. As a result, the logical level of latched data becomes more difficult to invert. Thus, in the second exemplary embodiment, in comparison with the first exemplary embodiment, the number of capacitor elements used in the capacitive element group 50 can be reduced and the soft error tolerance can be further increased.

At the time of pass-through, the transfer gates 12 and 43 are set in the shutoff state and the transfer gates 11, 41, and 42 are set in the conductive state, as in the first exemplary embodiment. The voltage at the first end and the voltage at the second end in the capacitor 53 are averaged thereby. As a result, charge transfer occurring between the storage nodes (T, B) and the capacitive element group 50 after changing into the latching state can be moderated. The amount of change in voltage level at the storage node T and the storage node B can be reduced to prevent inversion of the logical level of the latched data.

Further, it is noted that Applicant's intent is to encompass equivalents of all claim elements, even if amended later during prosecution.

What is claimed is:

1. A semiconductor integrated circuit, comprising:
a first inverter circuit which logically inverts a supplied signal and outputs a first inverted signal;
a second inverter circuit which logically inverts the first inverted signal output from the first inverter circuit and outputs a second inverted signal;
a pass-through/latch selector circuit which electrically connects an output end of the second inverter circuit and an input end of the first inverter circuit with each other at a time of latching, and which electrically shuts off the output end of the second inverter circuit and the input end of the first inverter circuit from each other at a time of pass-through;
a capacitive element which includes a first end and a second end, which increases a charge capacity at an output end of the first inverter circuit when the first end is connected to the output end of the first inverter circuit, and which increases a charge capacity at the output end of the second inverter circuit when the second end is connected to the output end of the second inverter circuit; and
a malfunction-preventing selector circuit which electrically connects the first end and the second end respectively to the output end of the first inverter circuit and the output end of the second inverter circuit at the time of latching, and which connects the first end and the second end with each other so that voltages at the first and second ends are equalized at the time of pass-through.

2. The semiconductor integrated circuit according to claim 1, wherein the malfunction-preventing selector circuit electrically shuts off between the first end and the output end of the first inverter circuit, and between the second end and the output end of the second inverter circuit at the time of pass-through.

3. The semiconductor integrated circuit according to claim 1, wherein the pass-through/latch selector circuit supplies an input signal to the input end of the first inverter circuit at the time of pass-through, and shuts off supply of the input signal to the first inverter circuit at the time of latching.

4. The semiconductor integrated circuit according to claim 1, wherein a power supply voltage to the first inverter circuit and the second inverter circuit is Vcc, and
wherein the malfunction-preventing selector circuit connects the first end and the second end with each other so that the voltages are ½ Vcc at the time of pass-through.

5. The semiconductor integrated circuit according to claim 4, wherein input threshold voltages of the first inverter circuit and the second inverter circuit are ½ Vcc.

6. The semiconductor integrated circuit according to claim 1, wherein the capacitive element includes a first capacitor having the first end, and a second capacitor having the second end, another end of the first capacitor and another end of the second capacitor are grounded, and the first capacitor and the second capacitor are equivalent to each other.

7. The semiconductor integrated circuit according to claim 1, wherein the capacitive element includes a capacitor having one end as the first end and another end as the second end.

8. A semiconductor integrated circuit, comprising:
a flip-flop circuit including a first node and a second node;
a capacitive element including a third node and a fourth node; and
a switch circuit coupled between the flip-flop circuit and the capacitive element, the switch circuit including:
a first switch circuit configured to couple the third and the fourth nodes to the first and the second nodes at a first timing; and
a second switch circuit configured to couple the third node with the fourth node at a second timing different from the first timing.

9. The semiconductor integrated circuit as claimed in claim 8, wherein the flip-flop circuit is constituted to function as a latch circuit at the first timing, and the flip-flop circuit is constituted to function as a signal pass-through at the second timing.

10. The semiconductor integrated circuit as claimed in claim 8, wherein the capacitive element includes first and second capacitors; and
wherein the first switch circuit includes a first transistor provided between the first capacitor and the first node of the flip-flop circuit and a second transistor provided between the second capacitor and the second node of the flip-flop circuit.

11. The semiconductor integrated circuit as claimed in claim 10, wherein the second switch circuit is connected between the first and second capacitors.

12. The semiconductor integrated circuit as claimed in claim 8, wherein the capacitive element includes a capacitor, and
wherein the first switch circuit includes a first switch provided between one end of the capacitor and a second switch provided between another end of the capacitor.

13. The semiconductor integrated circuit as claimed in claim 12, wherein the second switch circuit is provided between the one end and the other end of the capacitor.

14. A method of preventing a malfunction in a semiconductor integrated circuit, including:
a first inverter circuit which logically inverts a supplied signal and outputs a first inverted signal from an output end thereof;
a second inverter circuit which logically inverts the first inverted signal and outputs a second inverted signal;
a pass-through/latch selector circuit which electrically connects an output end of the second inverter circuit and an input end of the first inverter circuit with each other at a time of latching, and which electrically shuts off the output end of the second inverter circuit and the input end of the first inverter circuit from each other at a time of pass-through; and
a capacitive element which increases an electrical capacity at the output end of the first inverter circuit and at the output end of the second inverter circuit at the time of latching, the method comprising:
connecting a first end of the capacitive element to the output end of the first inverter circuit and a second end of the capacitive element to the output end of the second inverter circuit at the time of latching; and connecting the first end and the second end with each other so that voltages at first and second ends are equalized at the time of pass-through.

15. The method according to claim 14, further comprising:
electrically shutting off between the first end and the output end of the first inverter circuit, and between the second end and the output end of the second inverter circuit at the time of pass-through.

16. The method according to claim 14, further comprising:
supplying an input signal to the input end of the first inverter circuit at the time of pass-through; and shutting off supply of the supplied signal to the first inverter circuit at the time of latching.

17. The method according to claim 16, wherein input threshold voltages of the first inverter circuit and the second inverter circuit are ½ Vcc.

18. The method according to claim 14, wherein a power supply voltage to the first inverter circuit and the second inverter circuit is Vcc, and the connecting the first end and the second end includes connecting the first end and the second end with each other so as to provide ½ Vcc.

19. The method according to claim 14, wherein the capacitive element includes a first capacitor having the first end, and a second capacitor having the second end, wherein another end of the first capacitor and another end of the second capacitor are grounded, and wherein the first capacitor and the second capacitor are equivalent to each other.

20. The method according to claim 14, wherein the capacitive element includes a capacitor having one end as the first end and having another end as the second end.

* * * * *